(12) United States Patent
Li et al.

(10) Patent No.: US 10,948,525 B2
(45) Date of Patent: Mar. 16, 2021

(54) FAULT DETECTION DEVICE AND METHOD FOR SWITCH DRIVING CIRCUIT, AND ELECTRONIC DEVICE

(71) Applicant: Murata Manufacturing Co., Ltd., Nagaokakyo (JP)

(72) Inventors: Qiang Li, Shanghai (CN); Xiaojun Wang, Shanghai (CN)

(73) Assignee: MURATA MANUFACTURING CO., LTD., Kyoto (JP)

( * ) Notice: Subject to any disclaimer, the term of this patent is extended or adjusted under 35 U.S.C. 154(b) by 145 days.

(21) Appl. No.: 16/211,274

(22) Filed: Dec. 6, 2018

(65) Prior Publication Data

US 2019/0219617 A1 Jul. 18, 2019

(30) Foreign Application Priority Data

Jan. 15, 2018 (CN) .......................... 201810035324.7

(51) Int. Cl.
| | | |
|---|---|---|
| *G01R 31/40* | (2020.01) | |
| *G01R 19/165* | (2006.01) | |
| *H02M 1/08* | (2006.01) | |
| *G01R 19/17* | (2006.01) | |
| *H02M 1/32* | (2007.01) | |
| *H02M 3/158* | (2006.01) | |
| *H02M 3/335* | (2006.01) | |

(52) U.S. Cl.
CPC ....... *G01R 19/16538* (2013.01); *G01R 19/17* (2013.01); *H02M 1/08* (2013.01); *H02M 1/32* (2013.01); *H02M 3/158* (2013.01); *H02M 3/33576* (2013.01)

(58) Field of Classification Search
CPC . G01R 19/17; G01R 19/16538; H02M 1/084; H02M 1/36; H02M 3/157; H02M 3/1584; H02M 3/33576; H02M 3/33561
See application file for complete search history.

(56) References Cited

U.S. PATENT DOCUMENTS

| | | | |
|---|---|---|---|
| 8,218,338 B2 * | 7/2012 | Lin ........................ | H02M 1/10 323/266 |
| 2010/0165668 A1 * | 7/2010 | Lin ........................ | H02M 3/28 363/21.02 |

(Continued)

FOREIGN PATENT DOCUMENTS

CN 101005240 A 7/2007

OTHER PUBLICATIONS

Official Communication issued in corresponding Chinese Patent Application No. 201810035324.7, dated Dec. 10, 2020.

*Primary Examiner* — Thang X Le
(74) *Attorney, Agent, or Firm* — Keating & Bennett, LLP

(57) ABSTRACT

A DC-to-DC converter includes at least one primary switch, a primary inductor, and a switch rectifier circuit or a switch flyback circuit. A switch driving circuit is structured to drive the at least one primary switch. A fault detection method includes directly or indirectly detecting a voltage waveform or a current waveform of at least one terminal of the primary inductor, and determining whether the at least one primary switch is in a diode rectifying state or in a diode flyback state based on the voltage waveform or the current waveform to detect whether there is a fault in the switch driving circuit.

12 Claims, 8 Drawing Sheets

(56) References Cited

U.S. PATENT DOCUMENTS

| | | | | |
|---|---|---|---|---|
| 2015/0236595 A1* | 8/2015 | Babazadeh | ......... | H02M 3/1584 |
| | | | | 323/272 |
| 2015/0263639 A1* | 9/2015 | Russell | ................... | H02M 1/32 |
| | | | | 363/126 |
| 2017/0214318 A1* | 7/2017 | Takenaka | ................ | H02M 1/36 |
| 2018/0269797 A1* | 9/2018 | Vemuri | ............. | H02M 3/33523 |

* cited by examiner

FAULT DETECTION DEVICE AND METHOD FOR SWITCH DRIVING CIRCUIT, AND ELECTRONIC DEVICE

CROSS REFERENCE TO RELATED APPLICATIONS

This application claims the benefit of priority to Chinese Patent Application No. 201810035324.7 filed on Jan. 15, 2018. The entire contents of this application are hereby incorporated herein by reference.

BACKGROUND OF THE INVENTION

1. Field of the Invention

The present disclosure generally relates to circuit technology, and more particularly, to fault detection devices and methods for a switch driving circuit of a Direct Current (DC)-to-DC converter, and electronic devices.

2. Description of the Related Art

At present, multiple converters are usually coupled in parallel to provide a stable output or increase a total output power. As shown in FIG. 1, a maximum output power of two converters is 500 W, thus, a maximum load power that can be achieved is 1000 W. If a load's power is 1000 W and one of the converters fails, temperature can be monitored to detect which converter failed, and an alarm is generated accordingly. If the load's power is lower than 500 W and one of the converters fails, a fault may not be detected by monitoring the temperature sometimes (that is, the temperature may still be normal in the case of a fault). Details are described below.

When the converter includes a switch rectifier circuit using a rectifier switch, if the rectifier switch does not operate normally and is in an inactive state due to a fault, the rectifier switch can be regarded as a diode (i.e., its body diode), and the switch rectifier circuit can be regarded as a diode rectifier circuit. As a voltage drop and resistance of the body diode are higher than those of the rectifier switch, it will generate heat after running for a time period, so that a sensor that monitors the temperature can notify the fault in time. That is, such a fault can be detected in the existing techniques.

When the converter includes a switch rectifier circuit using a rectifier switch, if a switch driving circuit of a pre-stage circuit (also called a primary circuit, boost, buck, or buck-boost circuit) of the converter fails, an output of the converter 1 will reverse to an input from an output of the converter 2, as shown in FIG. 2. The reason lies in that switches in the rectifier circuit are turned on and off according to an established rule. After the current is reversed, the rectifier circuit can be regarded as a conversion circuit, and the pre-stage circuit can be regarded as a diode rectifier circuit as the switches cannot operate. After the current reverses from the output to the input, a buck converter will generate a boosted voltage, and a boost converter will generate a depressed voltage. However, it cannot be accurately determined whether there is a fault by detecting a direction of an output voltage or current, as even in a normal state, the above-mentioned current reversion occurs occasionally, and a duration and frequency of the reversion are determined according to environments of practical applications. Therefore, the above-described fault cannot be accurately determined by simple monitoring for the direction of the output voltage or current. Besides, the temperature may not change significantly during the current reversion. Therefore, in such cases, whether there is a fault in a converter cannot be determined.

SUMMARY OF THE INVENTION

Preferred embodiments of the present disclosure provide fault detection devices and methods for a switch driving circuit of a DC-to-DC converter that detect whether there is a fault in the switch driving circuit of the DC-to-DC converter including a switch rectifier circuit or a switch flyback circuit.

In a preferred embodiment of the present disclosure, a fault detection method for a switch driving circuit of a DC-to-DC converter is provided, wherein the DC-to-DC converter includes at least one primary switch, a primary inductor, and a switch rectifier circuit or a switch flyback circuit, the switch driving circuit is configured or structured to drive the at least one primary switch, and the method includes directly or indirectly detecting a voltage waveform or a current waveform of at least one terminal of the primary inductor, and determining whether the at least one primary switch is in a diode rectifying state or in a diode flyback state based on the voltage waveform or the current waveform.

In some preferred embodiments of the present disclosure, the DC-to-DC converter includes a primary circuit, a secondary circuit and a transformer coupling the primary circuit and the secondary circuit, the primary circuit includes the at least one primary switch, a primary inductor, and a primary winding of the transformer, the secondary circuit includes a secondary winding of the transformer, and the switch rectifier circuit or the switch flyback circuit, and directly or indirectly detecting a voltage waveform or a current waveform of at least one terminal of the primary inductor includes detecting a voltage waveform or a current waveform of a tap of the secondary winding of the transformer.

In some preferred embodiments of the present disclosure, determining whether the at least one primary switch is in a diode rectifying state or in a diode flyback state based on the voltage waveform or the current waveform includes determining whether the voltage waveform generates a resonance with a period shorter than a switching period of a rectifier switch or a flyback switch, wherein the rectifier switch is disposed in the switch rectifier circuit, and the flyback switch is disposed in the switch flyback circuit, and if it is determined that the resonance is generated, determining that the at least one primary switch is in the diode rectifying state or in the diode flyback state.

In some preferred embodiments of the present disclosure, determining whether the at least one primary switch is in a diode rectifying state or in a diode flyback state based on the voltage waveform or the current waveform includes determining whether a duration of a low level in the voltage waveform meets a predetermined condition, and if the duration of the low level in the voltage waveform meets the predetermined condition, determining that the at least one primary switch is in the diode rectifying state or in the diode flyback state.

In some preferred embodiments of the present disclosure, determining whether the duration of the low level in the voltage waveform meets the predetermined condition includes determining whether the number of times of the voltage waveform rising from a first voltage to a second voltage within a first predetermined time period is smaller than a predetermined number.

In some preferred embodiments of the present disclosure, the method may further include smoothing the voltage waveform of the primary inductor, and determining whether the duration of the low level in the voltage waveform meets the predetermined condition includes determining whether a valley point of the smoothed voltage waveform is higher than a threshold.

In some preferred embodiments of the present disclosure, the method may further include smoothing the voltage waveform, and determining whether the duration of the low level in the voltage waveform meets the predetermined condition includes determining whether the number of times of the smoothed voltage waveform rising from a first voltage to a second voltage within a first predetermined time period is smaller than a predetermined number.

In some preferred embodiments of the present disclosure, determining whether the at least one primary switch is in a diode rectifying state or in a diode flyback state based on the voltage waveform or the current waveform includes determining whether a period of the current waveform is shorter than a predetermined period, and if the period of the current waveform is shorter than the predetermined period, determining that the at least one primary switch is in the diode rectifying state or in the diode flyback state.

In some preferred embodiments of the present disclosure, determining whether the at least one primary switch is in a diode rectifying state or in a diode flyback state based on the voltage waveform or the current waveform includes determining whether a duration of a falling edge of the current waveform is shorter than a second predetermined time period, and if the duration of the falling edge of the current waveform is shorter than the second predetermined time period, determining that the at least one primary switch is in the diode rectifying state or in the diode flyback state.

In a preferred embodiment of the present disclosure, a fault detection device for a switch driving circuit of a DC-to-DC converter is provided, wherein the DC-to-DC converter includes at least one primary switch, a primary inductor, and a switch rectifier circuit or a switch flyback circuit, the switch driving circuit is structured to drive the at least one primary switch, and the device includes a detection circuitry to directly or indirectly detect a voltage waveform or a current waveform of at least one terminal of the primary inductor, and a determination circuitry to determine whether the at least one primary switch is in a diode rectifying state or in a diode flyback state based on the voltage waveform or the current waveform.

In some preferred embodiments of the present disclosure, a DC-to-DC converter includes a primary circuit, a secondary circuit and a transformer coupling the primary circuit and the secondary circuit, the primary circuit includes the at least one primary switch, the primary inductor, and a primary winding of the transformer, the secondary circuit includes a secondary winding of the transformer, and the switch rectifier circuit or the switch flyback circuit, and the detection circuitry is structured to detect a voltage waveform or a current waveform of a tap of the secondary winding of the transformer.

In some preferred embodiments of the present disclosure, the determination circuitry is structured to determine whether the voltage waveform generates a resonance with a period shorter than a switching period of a rectifier switch or a flyback switch, wherein the rectifier switch is disposed in the switch rectifier circuit, and the flyback switch is disposed in the switch flyback circuit, and if it is determined that the resonance is generated, the determination circuitry is structured to determine that the at least one primary switch is in the diode rectifying state or in the diode flyback state.

In some preferred embodiments of the present disclosure, the determination circuitry is structured to determine whether a duration of a low level in the voltage waveform meets a predetermined condition, and if the duration of the low level in the voltage waveform meets the predetermined condition, the determination circuitry is structured to determine that the at least one primary switch is in the diode rectifying state or in the diode flyback state.

In some preferred embodiments of the present disclosure, the determination circuitry is structured to determine whether the number of times of the voltage waveform rising from a first voltage to a second voltage within a first predetermined time period is smaller than a predetermined number, and if the number of times of the voltage waveform rising from the first voltage to the second voltage within the first predetermined time period is smaller than the predetermined number, the determination circuitry is structured to determine that the at least one primary switch is in the diode rectifying state or in the diode flyback state.

In some preferred embodiments of the present disclosure, the detection circuitry includes a sampling circuitry to detect the voltage waveform, and a processing circuitry to smooth the voltage waveform, and the determination circuitry is structured to determine whether a valley point of the smoothed voltage waveform is higher than a threshold, and if the valley point of the smoothed voltage waveform is higher than the threshold, the determination circuitry is structured to determine that the at least one primary switch is in the diode rectifying state or in the diode flyback state.

In some preferred embodiments of the present disclosure, the detection circuitry includes a sampling circuitry to detect the voltage waveform, and a processing circuitry to smooth the voltage waveform, and the determination circuitry is structured to determine whether the number of times of the smoothed voltage waveform rising from a first voltage to a second voltage within a first predetermined time period is smaller than a predetermined number, and if the number of times of the smoothed voltage waveform rising from the first voltage to the second voltage within the first predetermined time period is smaller than the predetermined number, the determination circuitry is structured to determine that the at least one primary switch is in the diode rectifying state or in the diode flyback state.

In some preferred embodiments of the present disclosure, the processing circuitry includes an input terminal to receive the voltage waveform, an output terminal to output the smoothed voltage waveform, and a capacitor including a first terminal coupled with the input terminal and the output terminal, and a second terminal grounded.

In some preferred embodiments of the present disclosure, the determination circuitry is structured to determine whether a period of the current waveform is shorter than a predetermined period, and if the period of the current waveform is shorter than the predetermined period, the determination circuitry is structured to determine that the at least one primary switch is in the diode rectifying state or in the diode flyback state.

In some preferred embodiments of the present disclosure, the determination circuitry is structured to determine whether a duration of a falling edge of the current waveform is shorter than a second predetermined time period, and if the duration of the falling edge of the current waveform is shorter than the second predetermined time period, the determination circuitry is structured to determine that the at least one primary switch is in the diode rectifying state or in the diode flyback state.

In a preferred embodiment of the present disclosure, an electronic device includes the fault detection device for the switch driving circuit of the DC-to-DC converter according to one of the above-described preferred embodiments of the present disclosure.

Preferred embodiments of the present disclosure may provide following advantages. By the fault detection method or device for the switch driving circuit of the DC-to-DC converter, the voltage waveform or the current waveform of at least one terminal of the primary inductor is directly or indirectly detected, and whether the at least one primary switch is in the diode rectifying state or in the diode flyback state is determined based on the voltage waveform or the current waveform. In this way, whether there is a fault in the switch driving circuit of the DC-to-DC converter is able to be detected.

Further, the DC-to-DC converter includes the primary circuit, the secondary circuit and the transformer coupling the primary circuit and the secondary circuit. The voltage waveform or the current waveform of the tap of the secondary winding of the transformer is detected to determine whether the at least one primary switch is in the diode rectifying state. In this way, whether there is a fault in the secondary driving circuit of the DC-to-DC converter is able to be detected.

The above and other elements, features, steps, characteristics and advantages of the present disclosure will become more apparent from the following detailed description of the preferred embodiments with reference to the attached drawings.

DETAILED DESCRIPTION OF THE PREFERRED EMBODIMENTS

As described in the background, when a converter includes a switch rectifier circuit or a switch flyback circuit, if a switch driving circuit of a pre-stage circuit of the converter fails, existing solutions cannot effectively detect the fault in the switch driving circuit.

Preferred embodiments of the present disclosure provide fault detection method or device for the switch driving circuit of the DC-to-DC converter. A voltage waveform or a current waveform of at least one terminal of a primary inductor is directly or indirectly detected, and whether at least one primary switch is in a diode rectifying state or in a diode flyback state is determined based on the voltage waveform or the current waveform. In this way, whether there is a fault in the switch driving circuit of the DC-to-DC converter is able to be detected.

Solutions and advantages of preferred embodiments of the present disclosure will be described clearly in detail in conjunction with accompanying drawings.

Figure 1:
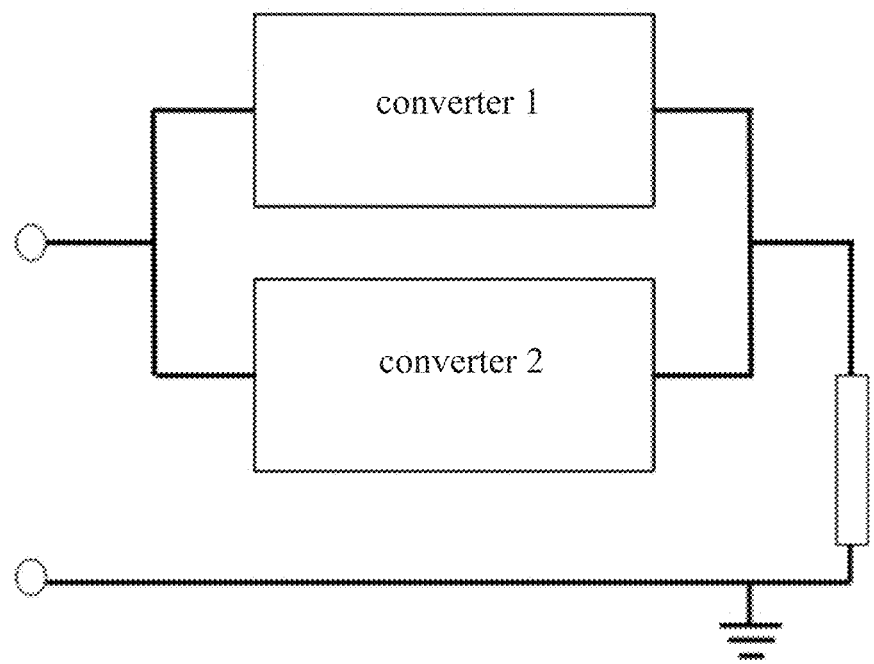
FIGS. 1 and 2 schematically illustrate structural diagrams of a circuit including converters in existing techniques.
Figure 2:
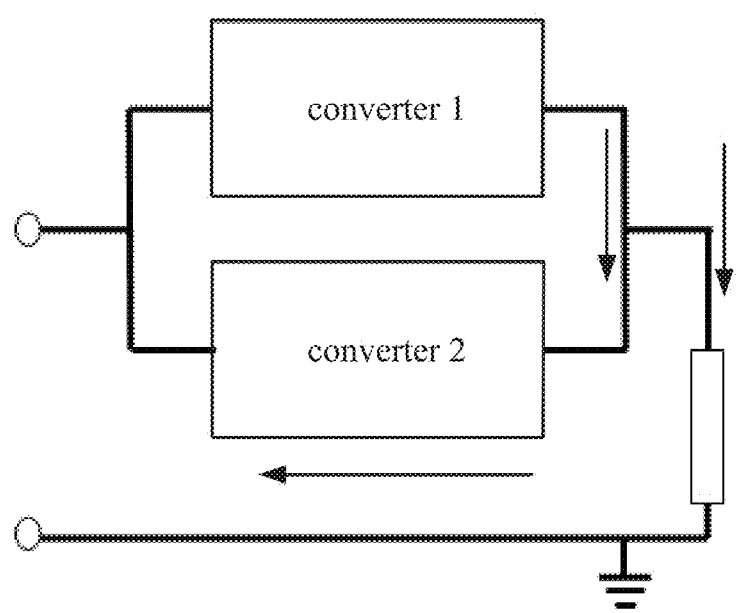
Figure 3:
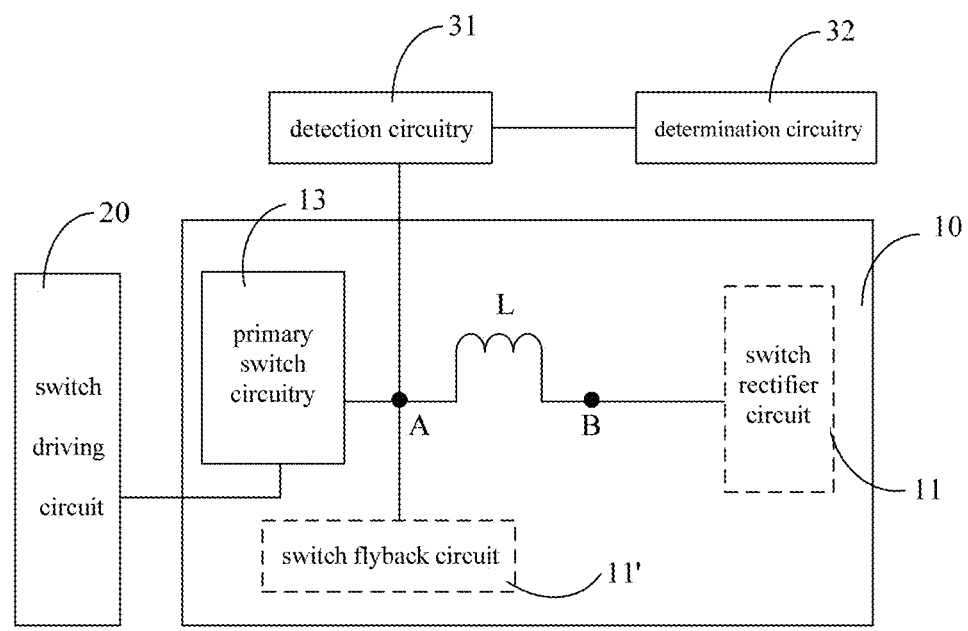
FIG. 3 schematically illustrates a structural diagram of a fault detection device for a switch driving circuit of a DC-to-DC converter according to a preferred embodiment of the present disclosure.

FIG. 3 schematically illustrates a structural diagram of a fault detection device for a switch driving circuit of a DC-to-DC converter according to a preferred embodiment. The DC-to-DC converter 10 includes a primary switch circuitry 13 (including at least one primary switch), a primary inductor L coupled with the primary switch circuitry 13, and a switch rectifier circuit 11 or a switch flyback circuit 11'. The switch driving circuit 20 is structured to drive the primary switch circuitry 13, and the device includes: a detection circuitry 31 to directly or indirectly detect a voltage waveform or a current waveform of at least one terminal of the primary inductor L, and a determination circuitry 32 to determine whether the primary switch circuitry 13 is in a diode rectifying state or in a diode flyback state based on the voltage waveform or the current waveform.

In some preferred embodiments of the present disclosure, the primary switch is a power switch, and the primary inductor L is a power inductor.

In some preferred embodiments of the present disclosure, the primary switch circuitry 13 (i.e., the at least one primary switch) being in the diode rectifying state means that electrical characteristics of the at least one primary switch approach electrical characteristics of a diode when the DC-to-DC converter includes the switch rectifier circuit.

The primary switch circuitry 13 (i.e., the at least one primary switch) being in the diode flyback state means that electrical characteristics of the at least one primary switch approach electrical characteristics of a diode when the DC-to-DC converter 10 includes the switch flyback circuit.

Referring to FIG. 3, the detection circuitry 31 is directly coupled with one terminal A of the primary inductor L. It should be noted that, in some preferred embodiments of the present disclosure, the detection circuitry 31 may be directly or indirectly coupled with the other terminal B of the primary inductor L.

Figure 4:
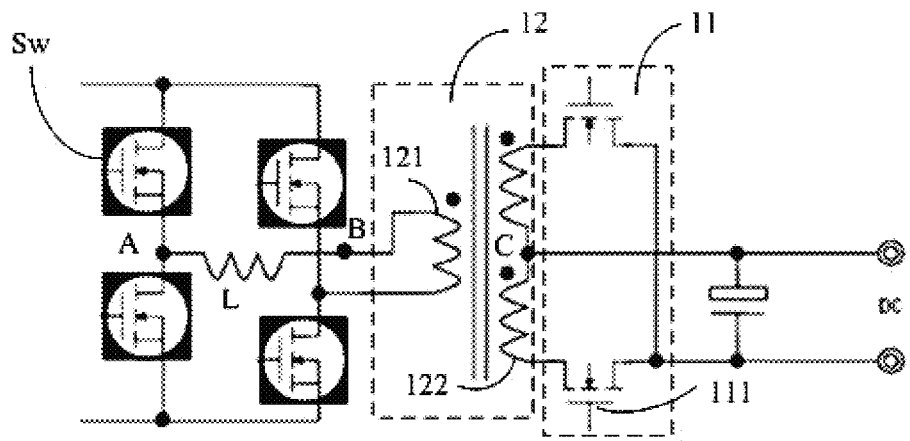
FIG. 4 schematically illustrates a structural diagram of the DC-to-DC converter in the fault detection device for the switch driving circuit as shown in FIG. 3 according to a preferred embodiment of the present disclosure.

FIG. 4 schematically illustrates a structural diagram of the DC-to-DC converter in the fault detection device for the switch driving circuit as shown in FIG. 3 according to a preferred embodiment of the present disclosure. Solutions provided by preferred embodiments of the present disclosure are described in detail below.

In some preferred embodiments of the present disclosure, the DC-to-DC converter includes a primary circuit, a secondary circuit and a transformer 12 coupling the primary circuit and the secondary circuit, the primary circuit includes four primary switches $S_w$, the primary inductor L, and a primary winding 121 of the transformer, the secondary circuit includes a secondary winding 122 of the transformer, and the switch rectifier circuit 11 which includes two rectifier switches 111.

In some preferred embodiments of the present disclosure, the detection circuitry 31 is structured to detect a voltage waveform or a current waveform of a tap C of the secondary winding 122 of the transformer.

In some preferred embodiments of the present disclosure, if the detection circuitry 31 is structured to detect the voltage waveform, the determination circuitry 32 is structured to determine whether the voltage waveform generates a resonance with a period shorter than a switching period of the rectifier switch 111, and if it is determined that the resonance is generated, the determination circuitry is structured to determine that the primary switches $S_w$ are in the diode rectifying state. That is, the switch driving circuit 20 is determined to have a fault.

Figure 5:
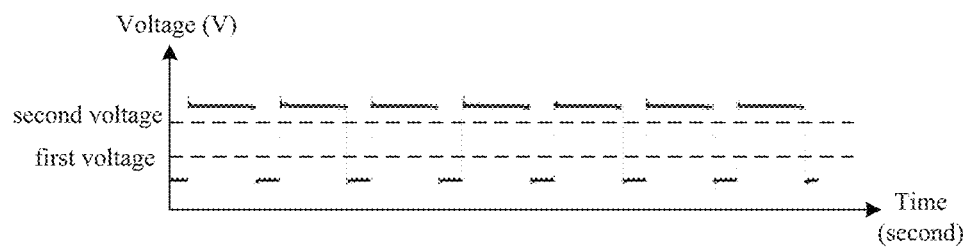
FIG. 5 schematically illustrates a voltage waveform of a tap C of a secondary winding of a transformer in the DC-to-DC converter as shown in FIG. 4.
Figure 6:
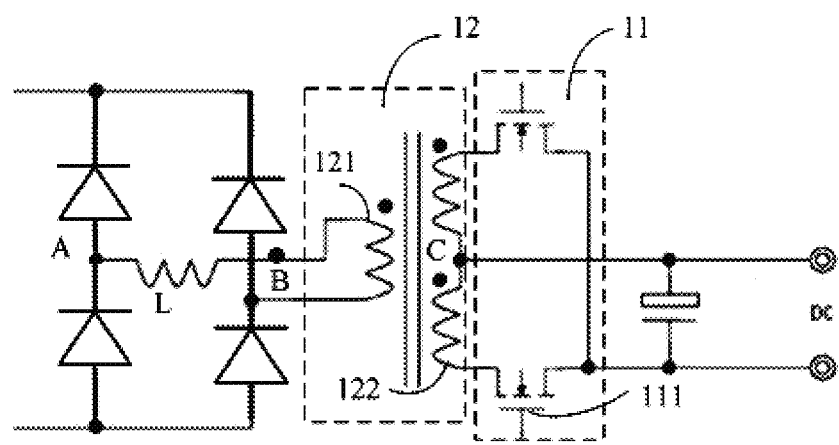
FIG. 6 schematically illustrates a structural diagram of the DC-to-DC converter as shown in FIG. 4 when there is a fault in the switch driving circuit.
Figure 7:
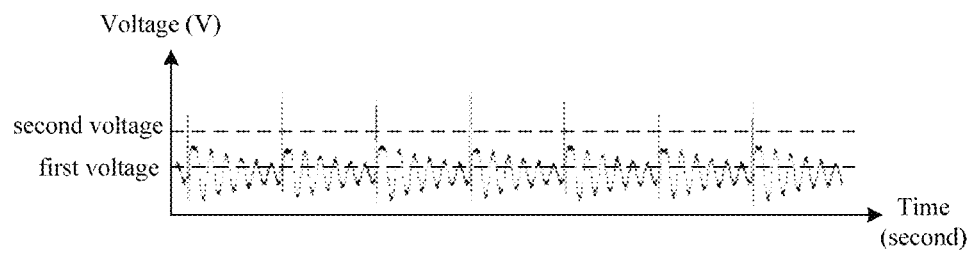
FIG. 7 schematically illustrates a voltage waveform of a tap C of a secondary winding of a transformer in the DC-to-DC converter as shown in FIG. 6.

Referring to FIGS. 5 to 7, FIG. 5 schematically illustrates a voltage waveform of the tap C when the switch driving circuit 20 operates normally. FIG. 6 schematically illustrates a structural diagram of the DC-to-DC converter 10 when there is a fault in the switch driving circuit 20. FIG. 7 schematically illustrates a voltage waveform of the tap C when there is a fault in the switch driving circuit 20.

As shown in FIG. 6, when the switch driving circuit 20 fails, the four primary switches $S_w$ are equivalent to four diodes with parallel parasitic capacitors, and these parasitic capacitors or parasitic capacitors on the rectifier switches 111 may generate a resonance with the primary inductor L, where a period of the resonance is shorter than a switching period of the rectifier switches 111. Besides, a characteristic of diode rectification lies in that the diode has a relatively small duty ratio (the diode is unidirectional, while the switch is bi-directional), and a duration of a low level at the tap C is relatively short (relatively to a case that a reverse voltage is generated when the switch driving circuit is not damaged).

Referring to FIG. 7, when the switch driving circuit 20 fails, the voltage waveform of the tap C generates oscillation, and amplitude of the oscillation is less than the switching period of the rectifier switches 111. Therefore, in some preferred embodiments of the present disclosure, whether there is a fault in the switch driving circuit 20 may be determined by determining whether the voltage waveform generates a resonance having a period shorter than the switching period of the rectifier switches 111.

In some preferred embodiments of the present disclosure, if the detection circuitry 31 is structured to detect the voltage waveform, the determination circuitry 32 is structured to determine whether a duration of a low level in the voltage waveform meets a predetermined condition, and if the duration of the low level in the voltage waveform meets the predetermined condition, the determination circuitry determines that the primary switches are in the diode rectifying state.

Still referring to FIGS. 5 and 7, when the switch driving circuit 20 fails, a duration of a low level in a voltage waveform of the tap C is significantly shorter than a duration of a low level in a voltage waveform of the tap C when the switch driving circuit 20 is normal. Therefore, in some preferred embodiments of the present disclosure, whether there is a fault in the switch driving circuit 20 may be determined by determining whether the duration of the low level in the voltage waveform meets the predetermined condition. In some preferred embodiments of the present disclosure, the predetermined condition may be "being shorter than a duration of a low level in a voltage waveform of the tap C when the switch driving circuit is normal".

In some preferred embodiments of the present disclosure, whether there is a fault in the switch driving circuit may be determined by counting the number of low levels within a predetermined time. If the number of the low levels within the predetermined time is smaller than a predetermined number, it is determined that there is a fault.

In some preferred embodiments of the present disclosure, if the detection circuitry 31 is structured to detect the voltage waveform, the determination circuitry 32 is structured to determine whether the number of times of the voltage waveform rising from a first voltage to a second voltage within a first predetermined time period is smaller than a predetermined number, and if the number of times of the voltage waveform rising from the first voltage to the second voltage within the first predetermined time period is smaller than the predetermined number, the determination circuitry is structured to determine that the primary switches are in the diode rectifying state.

Still referring to FIGS. 5 and 7, within a same time period, the number of times of the voltage waveform rising from the first voltage to the second voltage when the switch driving circuit 20 fails is significantly smaller than that when the switch driving circuit 20 is normal. Therefore, in some preferred embodiments of the present disclosure, whether there is a fault in the switch driving circuit 20 may be determined by determining whether the number of times of the voltage waveform rising from the first voltage to the second voltage within the first predetermined time period is smaller than the predetermined number. In some preferred embodiments of the present disclosure, the predetermined number may be the number of times of the voltage waveform rising from the first voltage to the second voltage when the switch driving circuit is normal. The first predetermined time period may be one second, two seconds, three seconds or the like.

In some preferred embodiments of the present disclosure, the first voltage is a minimum operating voltage of a processor that controls operation of the DC-to-DC converter 10, and the second voltage is a maximum operating voltage of the processor that controls operation of the DC-to-DC converter 10. The processor may be an MCU, a DSP or the like. In some preferred embodiments of the present disclosure, the minimum operating voltage of the processor may be within a range from about 0.8 V to about 1.5 V, and the maximum operating voltage of the processor may be within a range from about 1.8 V to about 2.5 V, for example.

In the above preferred embodiments of the present disclosure, measuring the voltage waveform of the tap C is described as an example to explain solutions of preferred embodiments of the present disclosure. The tap C is coupled with a terminal B of the primary inductor L via the transformer. Therefore, the above preferred embodiments are indirectly measuring the voltage waveform of one terminal of the primary inductor L. In some preferred embodiments of the present disclosure, the voltage waveform of one terminal of the primary inductor L may be measured directly, for example, measuring a voltage waveform of point A or B. Similarly, when the voltage waveform of one terminal A or B of the primary inductor L is measured directly, detection methods provided in the above preferred embodiments may also be applied to determine whether there is a fault in the switch driving circuit.

In some preferred embodiments of the present disclosure, the detection circuitry 31 and the determination circuitry 32 include a processor that controls the DC-to-DC converter, such as an MCU or DSP. This requires strong operation capability of the processor. To reduce a work load of the processor and improve efficiency, the detection circuitry may be an extra circuit other than the processor.

In some preferred embodiments of the present disclosure, the detection circuitry includes a sampling circuitry to detect the voltage waveform, and a processing circuitry to smooth the voltage waveform. The determination circuitry may be structured to determine whether a valley point of the smoothed voltage waveform is higher than a threshold, and if the valley point of the smoothed voltage waveform is higher than the threshold, the determination circuitry is structured to determine that the at least one primary switch is in the diode rectifying state. Alternatively, the determination circuitry may be structured to determine whether the number of times of the smoothed voltage waveform rising from a first voltage to a second voltage within a first predetermined time period is smaller than a predetermined number, and if the number of times of the smoothed voltage waveform rising from the first voltage to the second voltage within the first predetermined time period is smaller than the predetermined number, the determination circuitry is structured to determine that the at least one primary switch is in the diode rectifying state.

Figure 8:
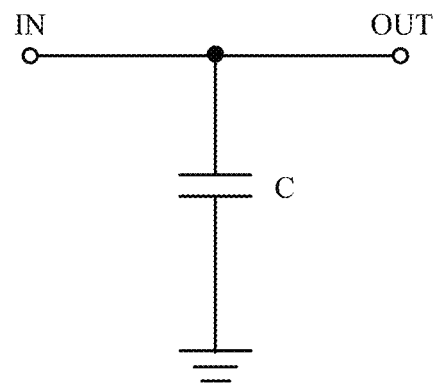
FIG. 8 schematically illustrates a structural diagram of a processing circuitry in a detection circuitry as shown in FIG. 4 according to a preferred embodiment of the present disclosure.

FIG. 8 schematically illustrates a simplest structure of the processing circuitry. In some preferred embodiments of the present disclosure, the processing circuitry includes an input terminal IN that receives the voltage waveform, an output terminal OUT that outputs the smoothed voltage waveform, and a capacitor C including a first terminal coupled with the input terminal and the output terminal, and a second terminal grounded.

In some preferred embodiments of the present disclosure, by setting the capacitor C, the voltage waveform is smoothed by charging and discharging of the capacitor C to generate a smooth straight line or curve. Those skilled in the art can understand that, whether it is a straight line or a curve, if a duration of a low level is too short (i.e., when the switch driving circuit fails), a minimum voltage of the smoothed voltage waveform must be higher than a minimum voltage of the smoothed voltage waveform when the duration of the low level is long (i.e., when the switch driving circuit is normal). Therefore, it is possible to determine whether there is a fault in the switch driving circuit by determining whether the valley point of the smoothed voltage waveform is higher than a threshold.

Figure 9:
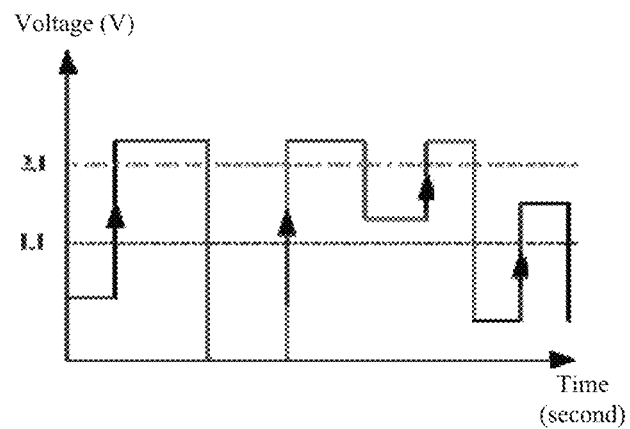
FIG. 9 schematically illustrates a smoothed voltage waveform according to a preferred embodiment of the present disclosure.

In some preferred embodiments of the present disclosure, whether there is a fault in the switch driving circuit is determined by determining whether the number of times of the smoothed voltage waveform rising from a first voltage to a second voltage within a first predetermined time period is smaller than a predetermined number. FIG. 9 schematically illustrates a smoothed voltage waveform according to a preferred embodiment of the present disclosure. In the preferred embodiment, the first voltage is about 1.1 V, the second voltage is about 2.1 V, and the number of times of the smoothed voltage waveform rising from the first voltage to the second voltage within a unit time period is two. If the predetermined number is five, it is determined that there is a fault in the switch driving circuit.

Figure 10:
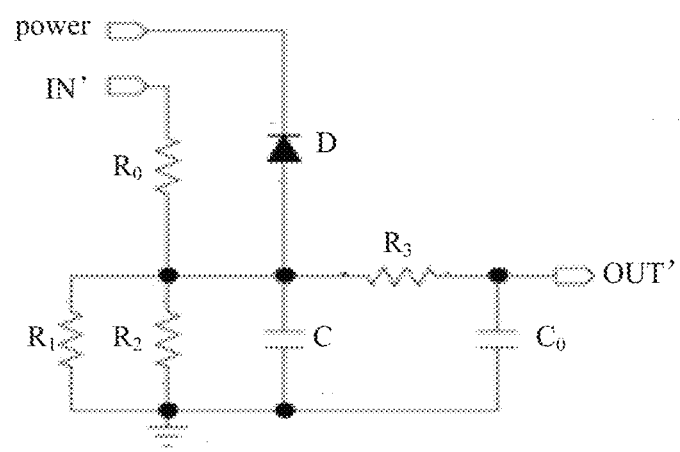
FIG. 10 schematically illustrates a structural diagram of a detection circuitry as shown in FIG. 4 according to a preferred embodiment of the present disclosure.

FIG. 10 schematically illustrates a structural diagram of the detection circuitry according to a preferred embodiment of the present disclosure. An input terminal IN' of the detection circuitry is coupled with a detected point (for example, point A, B or C in the converter as shown in FIG. 4), and an output terminal OUT' of the detection circuitry is coupled with the determination circuitry, such as a processor. The detection circuitry samples and smooths the voltage waveform of the detected point, and outputs the smoothed voltage waveform to the determination circuitry. As described above, the determination circuitry may be structured to determine whether a valley point of the smoothed voltage waveform is higher than a threshold, and if the valley point of the smoothed voltage waveform is higher than the threshold, the determination circuitry is structured to determine that the at least one primary switch is in the diode rectifying state. Alternatively, the determination circuitry may be structured to determine whether the number of times of the smoothed voltage waveform rising from a first voltage to a second voltage within a first predetermined time period is smaller than a predetermined number, and if the number of times of the smoothed voltage waveform rising from the first voltage to the second voltage within the first predetermined time period is smaller than the predetermined number, the determination circuitry is structured to determine that the at least one primary switch is in the diode rectifying state.

In the above preferred embodiments of the present disclosure, a fault in the switch driving circuit is detected via the voltage waveform. In some preferred embodiments of the present disclosure, a fault in the switch driving circuit may be detected via a current waveform.

In some preferred embodiments of the present disclosure, if the detection circuitry 31 is structured to detect the current waveform, the determination circuitry 32 is structured to determine whether a period of the current waveform is shorter than a predetermined period, and if the period of the current waveform is shorter than the predetermined period, the determination circuitry is structured to determine that the at least one primary switch is in the diode rectifying state.

In some preferred embodiments of the present disclosure, if the detection circuitry 31 is structured to detect the current waveform, the determination circuitry 32 is structured to determine whether a duration of a falling edge of the current waveform is shorter than a second predetermined time period, and if the duration of the falling edge of the current waveform is shorter than the second predetermined time period, the determination circuitry is structured to determine that the at least one primary switch is in the diode rectifying state.

Figure 11:
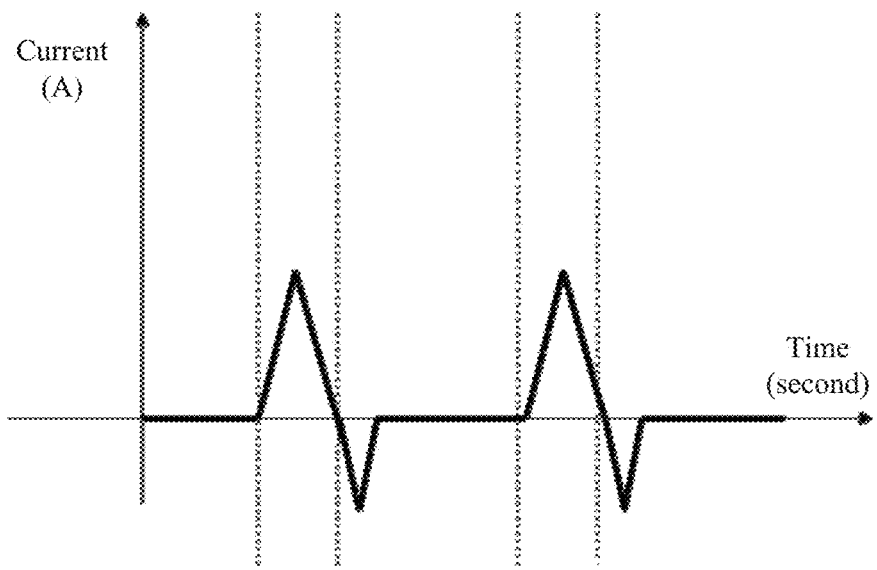
FIG. 11 schematically illustrates a current waveform of the tap C of the secondary winding of the transformer in the DC-to-DC converter as shown in FIG. 4.
Figure 12:
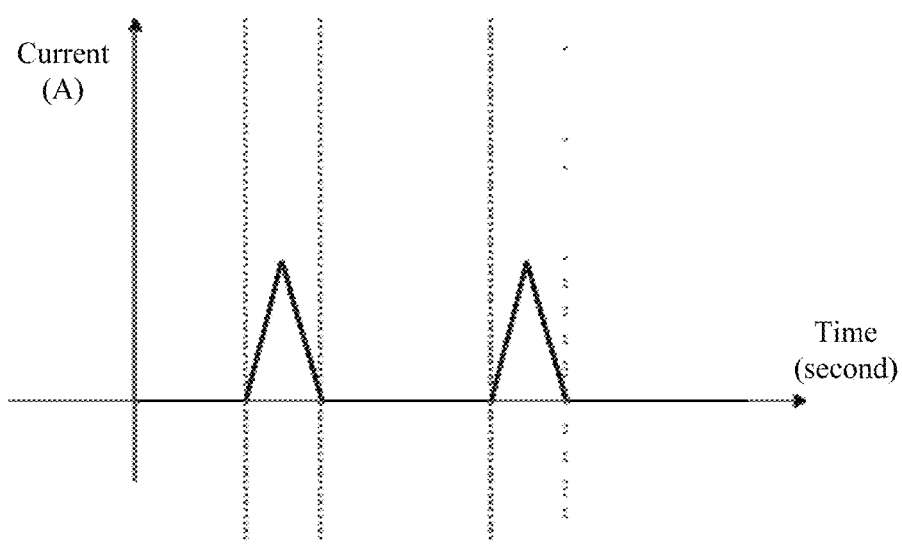
FIG. 12 schematically illustrates a current waveform of the tap C of the secondary winding of the transformer in the DC-to-DC converter as shown in FIG. 6.

Referring to FIGS. 11 and 12, FIG. 11 schematically illustrates a current waveform of the tap C of the secondary winding of the transformer in the DC-to-DC converter 10 as shown in FIG. 4 (when the switch driving circuit 20 is normal). FIG. 12 schematically illustrates a current waveform of the tap C of the secondary winding of the transformer in the DC-to-DC converter as shown in FIG. 6 (when there is a fault in the switch driving circuit 20). Comparing FIG. 11 with FIG. 12, when the switch driving circuit 20 is normal, the current waveform has a portion of negative values. However, when there is a fault in the switch driving circuit 20, i.e., when the primary switch is in a diode rectifying state, as a diode is unidirectional, the current waveform does not have a portion of negative values. Therefore, when a situation as shown in FIG. 11 is detected, it is possible to determine that there is a fault in the switch driving circuit. In some preferred embodiments of the present disclosure, when a period of the current waveform is shorter than a predetermined period, or a duration of a falling edge of the current waveform is shorter than a second predetermined time period, it is possible to determine that the primary switch is in a diode rectifying state.

It should be noted that, the above-mentioned various determination conditions may be separately used to determine whether the primary switch is in a diode rectification state, or any combination of the above-mentioned various determination conditions may be used for the determination.

In some preferred embodiments of the present disclosure, the DC-to-DC converter may not include a transformer. In the case, fault detection for the switch driving circuit may be realized by directly detecting a voltage waveform or a current waveform of any terminal of the primary inductor.

Figure 13:
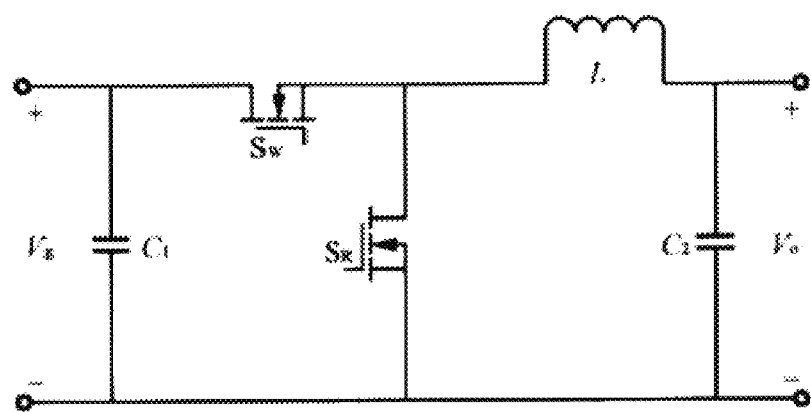
FIG. 13 schematically illustrates a structural diagram of the DC-to-DC converter in the fault detection device for the switch driving circuit as shown in FIG. 3 according to a preferred embodiment of the present disclosure.

In the above preferred embodiments of the present disclosure, the DC-to-DC converter includes a switch rectifier circuit. If the DC-to-DC converter includes a switch flyback circuit, the fault detection method for the switch driving circuit is similar. Referring to FIG. 13, FIG. 13 schematically illustrates a structural diagram of the DC-to-DC converter in the fault detection device for the switch driving circuit as shown in FIG. 3 according to a preferred embodiment of the present disclosure. The DC-to-DC converter includes a primary switch $S_w$, a primary inductor L, a switch flyback circuit including a flyback switch $S_R$, and capacitors C1 and C2 to smooth voltages.

In some preferred embodiments of the present disclosure, a voltage waveform or a current waveform of a terminal A or B of the primary inductor L may be measured for further determination to realize fault detection of the switch driving circuit.

Figure 14:
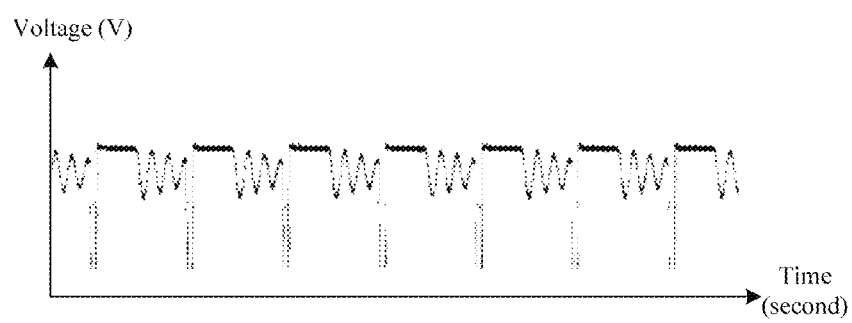
FIG. 14 schematically illustrates a voltage waveform of one terminal A of a primary inductor L in the DC-to-DC converter as shown in FIG. 13.
Figure 15:
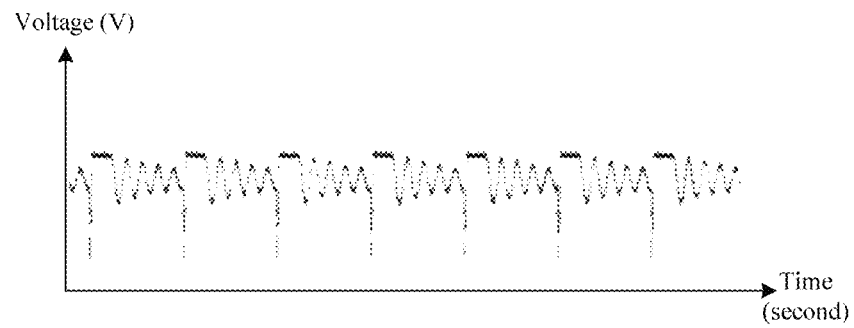
FIG. 15 schematically illustrates a voltage waveform of the other terminal B of the primary inductor L in the DC-to-DC converter as shown in FIG. 13.

FIGS. 14 and 15 schematically illustrate voltage waveforms of terminals A and B of the primary inductor L when there is a fault in the primary switch $S_w$ in the DC-to-DC converter as shown in FIG. 13. FIGS. 14 and 15 are similar with FIG. 7, the voltage waveform also has oscillation with a period shorter than that of the flyback switch $S_R$, and a duration of a low level is relatively short. Therefore, similarly with the above preferred embodiments of the present disclosure, when the DC-to-DC converter includes a switch flyback circuit, whether the primary switch is in a diode flyback state, i.e., whether there is a fault in the switch driving circuit, is determined by determining whether the voltage waveform generates a resonance with a period shorter than a switching period of a flyback switch, or by detecting a duration of a low level in the voltage waveform, or by detecting the number of times of the voltage waveform rising from a first voltage to a second voltage within a first predetermined time period.

In some preferred embodiments of the present disclosure, whether the primary switch is in the diode flyback state may be determined by detecting a valley point of a smoothed voltage waveform, or by detecting the number of times of the smoothed voltage waveform rising from the first voltage to the second voltage within the first predetermined time period.

In some preferred embodiments of the present disclosure, whether the primary switch is in the diode flyback state may be determined by the current waveform of the terminal A or B of the primary inductor L.

Detailed operations of the detection circuitry 31 and the determination circuitry 32 may be as described in the above preferred embodiments of the present disclosure, and are not described in detail here.

The DC-to-DC converter with a buck topology as shown in FIG. 13 is taken as an example to explain the solutions when the converter includes a switch flyback circuit. It could be understood by those skilled in the art that when the converter has a boost topology or a buck-boost topology, the solutions provided by the preferred embodiments of the present disclosure are still able to be used for fault detection of a switch driving circuit.

In a preferred embodiment of the present disclosure, an electronic device is provided, including the fault detection device for the switch driving circuit of the DC-to-DC converter provided in the above preferred embodiments.

Figure 16:
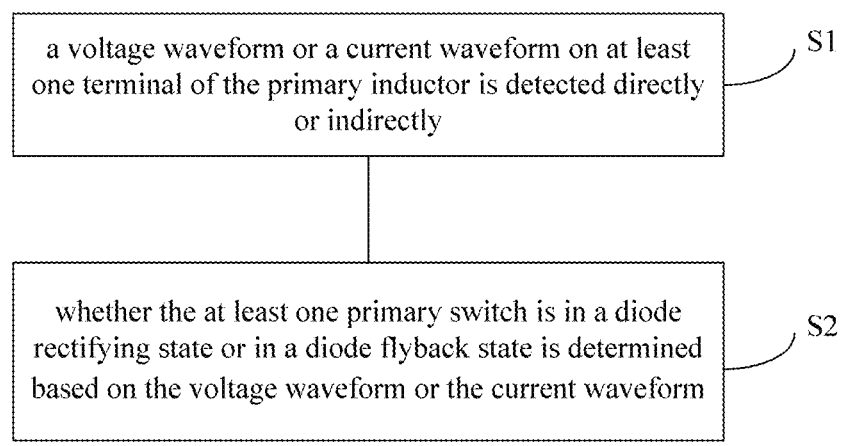
FIG. 16 schematically illustrates a flow chart of a fault detection method for a switch driving circuit of a DC-to-DC converter according to a preferred embodiment of the present disclosure.

Accordingly, in a preferred embodiment of the present disclosure, a fault detection method for a switch driving circuit of a DC-to-DC converter is provided. FIG. 16 schematically illustrates a flow chart of the fault detection method. The DC-to-DC converter includes at least one primary switch, a primary inductor, and a switch rectifier circuit or a switch flyback circuit, and the switch driving circuit is structured to drive the at least one primary switch. The method includes S1 and S2.

In S1, a voltage waveform or a current waveform of at least one terminal of the primary inductor is detected directly or indirectly.

In S2, whether the at least one primary switch is in a diode rectifying state or in a diode flyback state is determined based on the voltage waveform or the current waveform.

In some preferred embodiments of the present disclosure, indirectly detecting a voltage waveform or a current waveform of a terminal of the primary inductor may include detecting a voltage waveform or a current waveform of a component coupled with a terminal of the primary inductor. For example, a voltage waveform or a current waveform of a tap of a secondary winding of a transformer coupled with the primary inductor may be detected. In some preferred embodiments of the present disclosure, the primary switch is a power switch, and the primary inductor is a power inductor.

In some preferred embodiments of the present disclosure, the DC-to-DC converter includes a primary circuit, a secondary circuit and a transformer coupling the primary circuit and the secondary circuit, the primary circuit includes the at least one primary switch, the primary inductor, and a primary winding of the transformer, the secondary circuit includes a secondary winding of the transformer, and the switch rectifier circuit or the switch flyback circuit, and directly or indirectly detecting a voltage waveform or a current waveform of at least one terminal of the primary inductor includes detecting a voltage waveform or a current waveform of a tap of the secondary winding of the transformer.

In some preferred embodiments of the present disclosure, determining whether the at least one primary switch is in a diode rectifying state or in a diode flyback state based on the voltage waveform or the current waveform includes determining whether the voltage waveform generates a resonance with a period shorter than a switching period of a rectifier switch or a flyback switch, wherein the rectifier switch is disposed in the switch rectifier circuit, and the flyback switch is disposed in the switch flyback circuit, and if it is determined that the resonance is generated, determining that the at least one primary switch is in the diode rectifying state or in the diode flyback state.

In some preferred embodiments of the present disclosure, determining whether the at least one primary switch is in a diode rectifying state or in a diode flyback state based on the voltage waveform or the current waveform includes determining whether a duration of a low level in the voltage waveform meets a predetermined condition, and if the duration of the low level in the voltage waveform meets the predetermined condition, determining that the at least one primary switch is in the diode rectifying state or in the diode flyback state.

In some preferred embodiments of the present disclosure, determining whether the duration of the low level in the voltage waveform meets the predetermined condition includes determining whether the number of times of the voltage waveform rising from a first voltage to a second voltage within a first predetermined time period is smaller than a predetermined number.

In some preferred embodiments of the present disclosure, the method may further include smoothing the voltage waveform of the primary inductor, and determining whether the duration of the low level in the voltage waveform meets the predetermined condition includes determining whether a valley point of the smoothed voltage waveform is higher than a threshold.

In some preferred embodiments of the present disclosure, the method may further include smoothing the voltage waveform, and determining whether the duration of the low level in the voltage waveform meets the predetermined condition includes determining whether the number of times of the smoothed voltage waveform rising from a first voltage to a second voltage within a first predetermined time period is smaller than a predetermined number.

In some preferred embodiments of the present disclosure, determining whether the at least one primary switch is in a diode rectifying state or in a diode flyback state based on the voltage waveform or the current waveform includes determining whether a period of the current waveform is shorter than a predetermined period, and if the period of the current waveform is shorter than the predetermined period, determining that the at least one primary switch is in the diode rectifying state or in the diode flyback state.

In some preferred embodiments of the present disclosure, determining whether the at least one primary switch is in a diode rectifying state or in a diode flyback state based on the voltage waveform or the current waveform includes determining whether a duration of a falling edge of the current waveform is shorter than a second predetermined time period, and if the duration of the falling edge of the current waveform is shorter than the second predetermined time period, determining that the at least one primary switch is in the diode rectifying state or in the diode flyback state.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A fault detection method for a switch driving circuit of a Direct Current (DC)-to-DC converter, wherein the DC-to-DC converter includes at least one primary switch, a primary inductor, and a switch rectifier circuit or a switch flyback circuit, the switch driving circuit is structured to drive the at least one primary switch, the at least one primary switch is connected to the primary inductor, the method comprising:
   detecting a voltage waveform or a current waveform of at least one terminal of the primary inductor by detection circuitry;
   determining whether a duration of a low level in the voltage waveform meets a predetermined condition by determination circuitry; and
   if the duration of the low level in the voltage waveform meets the predetermined condition, determining, by the determination circuitry, that a fault in the switch driving circuit occurred when the at least one primary switch is in a diode rectifying state wherein the DC-to-DC converter includes the switch rectifier circuit, or the at least one primary switch is in a diode flyback state wherein the DC-to-DC converter includes the switch flyback circuit.

2. The method according to claim 1, wherein
   the DC-to-DC converter includes a primary circuit, a secondary circuit and a transformer coupling the primary circuit and the secondary circuit, the primary circuit includes the at least one primary switch, the primary inductor, and a primary winding of the transformer, and the secondary circuit includes a secondary winding of the transformer, and the switch rectifier circuit or the switch flyback circuit; and
   detecting a voltage waveform or a current waveform of at least one terminal of the primary inductor includes detecting a voltage waveform or a current waveform of a tap of the secondary winding of the transformer.

3. The method according to claim 1, wherein the determining whether the duration of the low level in the voltage waveform meets the predetermined condition includes:
   determining whether a number of times of the voltage waveform rising from a first voltage to a second voltage within a first predetermined time period is smaller than a predetermined number.

4. The method according to claim 1, further comprising:
   smoothing the voltage waveform of the primary inductor; wherein
   the determining whether the duration of the low level in the voltage waveform meets the predetermined condition includes determining whether a valley point of the smoothed voltage waveform is higher than a threshold.

5. The method according to claim 1, further comprising:
   smoothing the voltage waveform; wherein
   the determining whether the duration of the low level in the voltage waveform meets the predetermined condition includes determining whether a number of times of the smoothed voltage waveform rising from a first voltage to a second voltage within a first predetermined time period is smaller than a predetermined number.

6. A fault detection device for a switch driving circuit of a Direct Current (DC)-to-DC converter including at least one primary switch, a primary inductor, and a switch rectifier circuit or a switch flyback circuit, the switch driving circuit being structured to drive the at least one primary switch, the at least one primary switch being connected to the primary inductor, the fault detection device comprising:

a detection circuitry to detect a voltage waveform or a current waveform of at least one terminal of the primary inductor; and a determination circuitry to determine whether a duration of a low level in the voltage waveform meets a predetermined condition, wherein if the duration of the low level in the voltage waveform meets the predetermined condition, the determination circuitry determines that a fault in the switch driving circuit occurred when the at least one primary switch is in a diode rectifying state wherein the DC-to-DC converter includes the switch rectifier circuit, or the at least one primary switch is in a diode flyback state wherein the DC-to-DC converter includes the switch flyback circuit.

7. The device according to claim 6, wherein the DC-to-DC converter includes a primary circuit, a secondary circuit and a transformer coupling the primary circuit and the secondary circuit;

the primary circuit includes the at least one primary switch, the primary inductor, and a primary winding of the transformer; and the secondary circuit includes a secondary winding of the transformer, and the switch rectifier circuit or the switch flyback circuit; wherein the detection circuitry is structured to detect a voltage waveform or a current waveform of a tap of the secondary winding of the transformer.

8. The device according to claim 6, wherein the determination circuitry is structured to:

determine whether a number of times of the voltage waveform rising from a first voltage to a second voltage within a first predetermined time period is smaller than a predetermined number; and if the number of times of the voltage waveform rising from the first voltage to the second voltage within the first predetermined time period is smaller than the predetermined number, the determination circuitry is structured to determine that the at least one primary switch is in the diode rectifying state or in the diode flyback state.

9. The device according to claim 6, wherein the detection circuitry includes:

a sampling circuitry to detect the voltage waveform; and a processing circuitry to smooth the voltage waveform; wherein the determination circuitry is structured to:

determine whether a valley point of the smoothed voltage waveform is higher than a threshold; and if the valley point of the smoothed voltage waveform is higher than the threshold, the determination circuitry is structured to determine that the at least one primary switch is in the diode rectifying state or in the diode flyback state.

10. The device according to claim 9, wherein the processing circuitry includes:

an input terminal to receive the voltage waveform;

an output terminal to output the smoothed voltage waveform; and a capacitor including a first terminal coupled with the input terminal and the output terminal, and a second terminal grounded.

11. The device according to claim 6, wherein the detection circuitry includes:

a sampling circuitry to detect the voltage waveform; and a processing circuitry to smooth the voltage waveform; wherein the determination circuitry is structured to:

determine whether a number of times of the smoothed voltage waveform rising from a first voltage to a second voltage within a first predetermined time period is smaller than a predetermined number; and if the number of times of the smoothed voltage waveform rising from the first voltage to the second voltage within the first predetermined time period is smaller than the predetermined number, the determination circuitry is structured to determine that the at least one primary switch is in the diode rectifying state or in the diode flyback state.

12. An electronic device, comprising the fault detection device for the switch driving circuit of the DC-to-DC converter according to claim 6.

* * * * *